United States Patent
Egami

(10) Patent No.: US 10,573,677 B2
(45) Date of Patent: Feb. 25, 2020

(54) SEMICONDUCTOR DEVICE ON WHICH A TRANSPARENT PLATE IS DISPOSED FOR EXPOSING AN ELEMENT REGION

(71) Applicants: KABUSHIKI KAISHA TOSHIBA, Tokyo (JP); TOSHIBA ELECTRONIC DEVICES & STORAGE CORPORATION, Tokyo (JP)

(72) Inventor: Takao Egami, Kamakura Kanagawa (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 0 days.

(21) Appl. No.: 15/908,789

(22) Filed: Feb. 28, 2018

(65) Prior Publication Data

US 2019/0074311 A1 Mar. 7, 2019

(30) Foreign Application Priority Data

Sep. 5, 2017 (JP) .................. 2017-170041

(51) Int. Cl.
*H01L 27/146* (2006.01)
*H01L 23/00* (2006.01)

(52) U.S. Cl.
CPC .. *H01L 27/14618* (2013.01); *H01L 27/14649* (2013.01); *H01L 27/14683* (2013.01); *H01L 23/562* (2013.01)

(58) Field of Classification Search
CPC ......... H01L 27/14618; H01L 27/14649; H01L 27/14683; H01L 23/562; H01L 23/49861; H01L 21/4821–4842; H01L 23/495–49596

See application file for complete search history.

(56) References Cited

U.S. PATENT DOCUMENTS 6,677,178 B2    1/2004  Yagi
2005/0121661 A1*  6/2005  Beach ................. H01L 29/2003
                                                         257/11

(Continued)

FOREIGN PATENT DOCUMENTS

JP    S63-86460 A    4/1988
JP    H11-121653 A   4/1999

(Continued)

*Primary Examiner* — Nelson Garces
(74) *Attorney, Agent, or Firm* — Kim & Stewart LLP

(57) ABSTRACT

A semiconductor device includes an elongated plate having at least a pair of grooves or protrusions, which are spaced from each other in a width direction and extend without interruption in a longitudinal direction, on a surface of the elongated plate, a semiconductor chip mounted on the surface of the elongated plate and including an element region which extends in the longitudinal direction, a resin over the semiconductor chip, the resin forming a slit that extends in the longitudinal direction of the elongated plate, leaving the element region exposed, and a transparent plate that extends in the longitudinal direction of the elongated plate and is disposed on the slit to allow light transmission.

12 Claims, 4 Drawing Sheets

(56) References Cited

U.S. PATENT DOCUMENTS

| | | | | |
|---|---|---|---|---|
| 2015/0028345 A1* | 1/2015 | Wong | ............... | H01L 29/7787 |
| | | | | 257/76 |
| 2015/0041825 A1* | 2/2015 | Liu | ............... | H01L 29/66462 |
| | | | | 257/77 |
| 2015/0221757 A1* | 8/2015 | Nakayama | .......... | H01L 27/0605 |
| | | | | 257/20 |

FOREIGN PATENT DOCUMENTS

| | | |
|---|---|---|
| JP | 2001-267592 A | 9/2001 |
| JP | 2005-153335 A | 6/2005 |

\* cited by examiner

SEMICONDUCTOR DEVICE ON WHICH A TRANSPARENT PLATE IS DISPOSED FOR EXPOSING AN ELEMENT REGION

CROSS-REFERENCE TO RELATED APPLICATION

This application is based upon and claims the benefit of priority from Japanese Patent Application No. 2017-170041, filed Sep. 5, 2017, the entire contents of which are incorporated herein by reference.

FIELD

An embodiment described herein relates generally to a semiconductor device.

BACKGROUND

An on-vehicle infrared sensor is configured as a semiconductor chip formed with a light-receiving element mounted on a lead frame, and packaged with mold resin. In such a sensor package, as the chip size becomes longer, bending load (external stress) becomes likely. This load can affect sensing sensitivity.

DETAILED DESCRIPTION

Embodiments provide a semiconductor device having high strength with respect to a bending load.

In general, according to one embodiment, a semiconductor device includes an elongated plate having at least a pair of grooves or protrusions, which are spaced from each other in a width direction and extend without interruption in a longitudinal direction, on a surface of the elongated plate, a semiconductor chip mounted on the surface of the elongated plate and including an element region which extends in the longitudinal direction, a resin over the semiconductor chip, the resin forming a slit that extends in the longitudinal direction of the elongated plate, leaving the element region exposed, and a transparent plate that extends in the longitudinal direction of the elongated plate and is disposed on the slit to allow light transmission.

Hereinafter, an embodiment of the present disclosure is described with reference to the drawings. In the respective drawings, corresponding elements are given the same reference signs.

Figure 1:
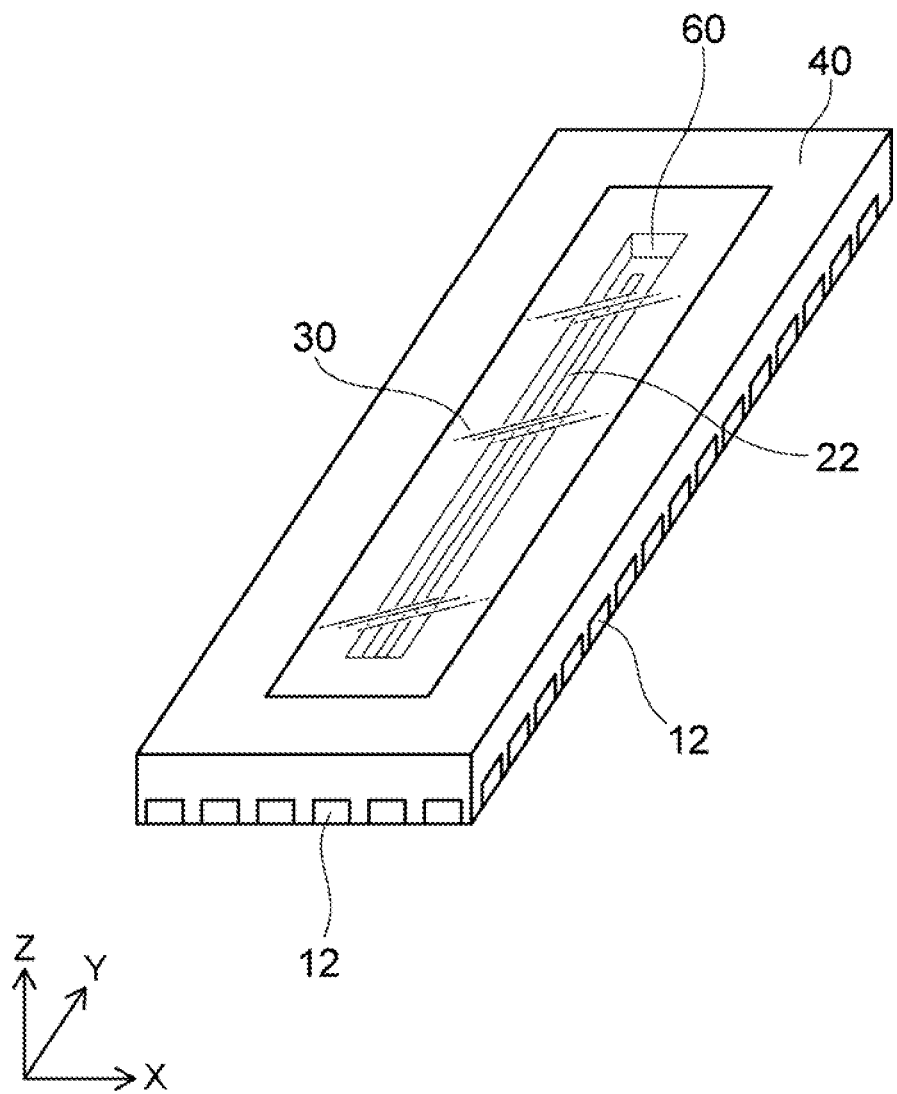
FIG. 1 is a schematic perspective view illustrating a semiconductor device according to an embodiment.

FIG. 1 is a schematic perspective view illustrating a semiconductor device according to an embodiment.

Figure 2:
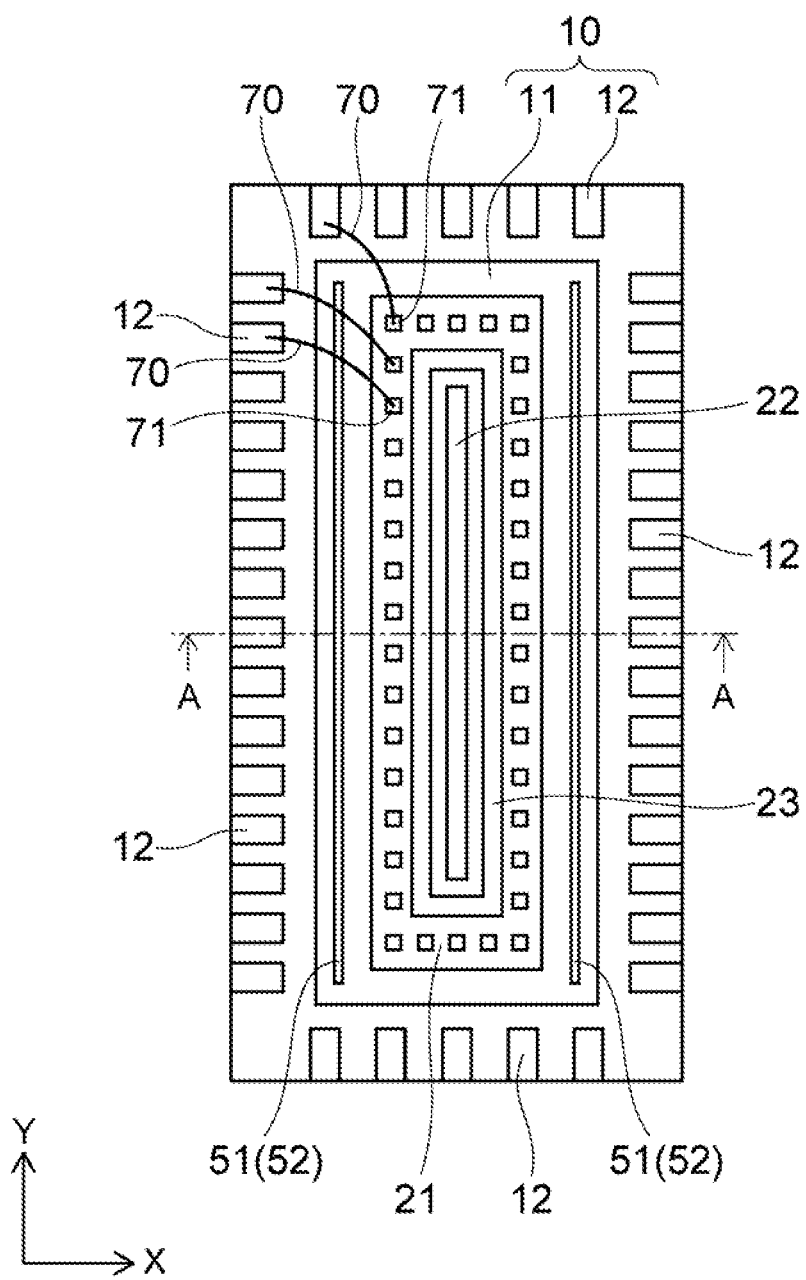
FIG. 2 is a schematic top view illustrating the semiconductor device according to the embodiment.

FIG. 2 is a schematic top view illustrating the semiconductor device according to an embodiment. A glass plate 30 and a resin 40 are omitted in FIG. 2.

Figure 3A:
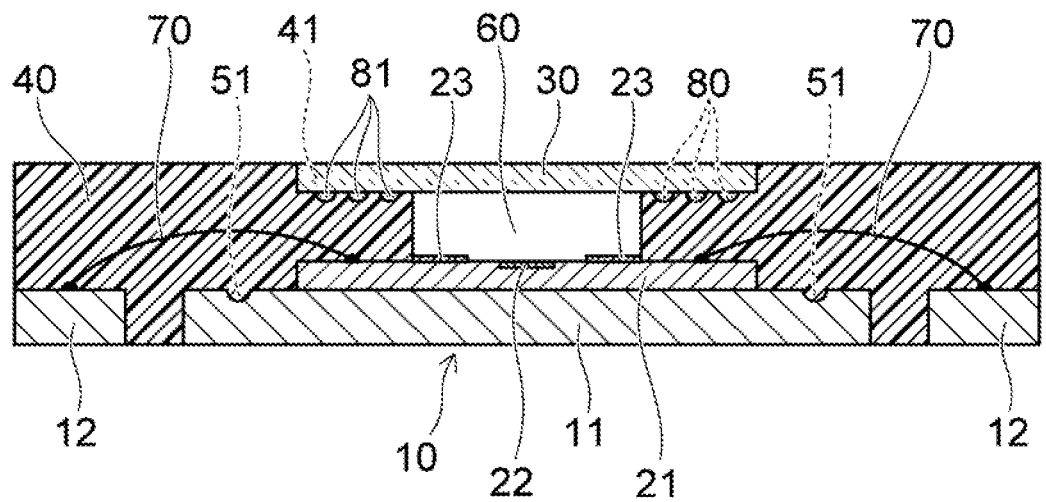
FIGS. 3A and 3B are cross-sectional views taken along line A-A in FIG. 2.
Figure 3B:
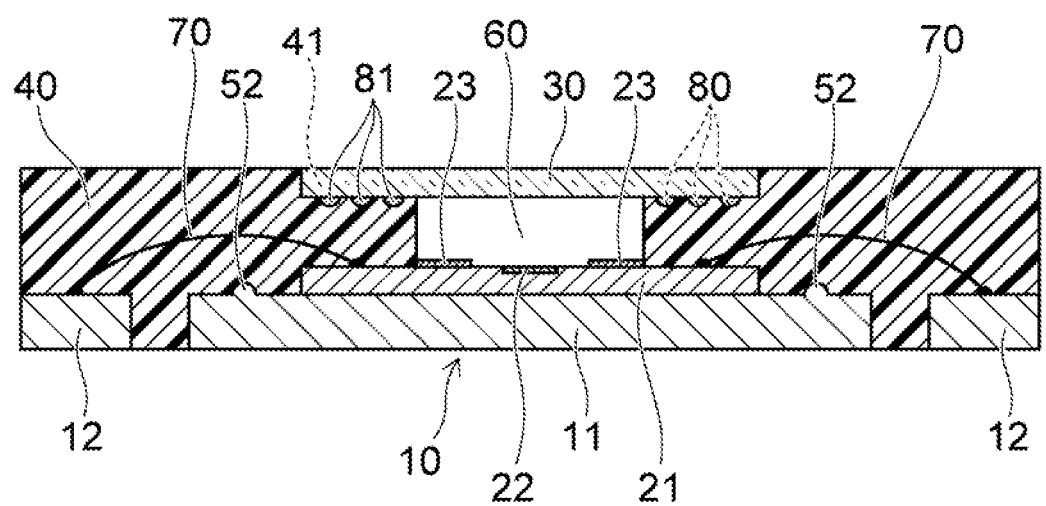

FIGS. 3A and 3B are cross-sectional views taken along line A-A in FIG. 2.

In FIGS. 1 and 2, an X-direction is a width direction of the semiconductor device and a Y-direction orthogonal to the X-direction is a longitudinal direction of the semiconductor device. A Z-direction shown in FIG. 1 is orthogonal to the X-direction and the Y-direction, and is a thickness direction of the semiconductor device.

The semiconductor device according to the embodiment is formed in a rectangular shape when viewed from the top, and the size of the semiconductor device in the longitudinal direction (Y-direction) is larger than the size thereof in the width direction (X-direction).

The semiconductor device according to the embodiment includes a lead frame 10, a semiconductor chip 21, a resin 40, and a glass plate 30.

The lead frame 10 includes one die pad 11 and a plurality of terminals 12. The die pad 11 is an elongated plate made of metal and having a rectangular shape, and the size of the die pad 11 in the longitudinal direction (Y-direction) is larger than the size thereof in the width direction (X-direction). The plurality of terminals 12 is spaced from the die pad 11, and disposed around the die pad 11. The terminal 12 in an embodiment is made of the same metal as the die pad 11.

The semiconductor chip 21 is mounted on an upper surface of the die pad 11. The semiconductor chip 21 is bonded onto the upper surface of the die pad 11 with a bonding material (not illustrated).

The semiconductor chip 21 is formed in a rectangular shape extending in the longitudinal direction (Y-direction) of the die pad 11, and the size of the semiconductor chip 21 in the longitudinal direction (Y-direction) is larger than the size thereof in the width direction (X-direction).

On an upper surface of the semiconductor chip 21, an element region 22 is formed to extend in the longitudinal direction (Y-direction). The element region 22 comprises light-receiving elements that sense infrared rays for example. The plurality of light-receiving elements is arranged in the element region (which is the sensing surface) 22 along the longitudinal direction (Y-direction).

As illustrated in FIG. 2, a plurality of electrode pads 71 is formed around the element region 22 on the upper surface of the semiconductor chip 21. The electrode pads 71 are connected to the terminals 12 of the lead frame 10 using wires 70. The plurality of wires 70 corresponds to the number of the plurality of electrode pads 71 and the number of the plurality of terminals 12. In FIG. 2, the wires 70 are partially illustrated.

A copper plate 23 around the element region 22 on the upper surface of the semiconductor chip 21 continuously surrounds the element region 22, for example. The plate 23 is formed in a region between the region in which the plurality of electrode pads 71 are disposed and the element region 22.

At least a pair of grooves (first grooves) 51 are formed on the upper surface of the die pad 11. The pair of grooves are spaced from each other in the width direction (X-direction) of the die pad 11 and continuously extend without interruption in the longitudinal direction (Y-direction). For example, the depth of the groove 51 is smaller than the half of the thickness of the die pad 11.

The semiconductor chip 21 is mounted in a region between the pair of grooves 51 on the upper surface of the die pad 11. The number of the groove 51 disposed on one side of the semiconductor chip 21 in the width direction is equal to the number of the groove 51 disposed on the other side of the semiconductor chip.

In the example shown in FIGS. 2 and 3A, one groove 51 is disposed on the left side of the semiconductor chip 21 and the other groove 51 is disposed on the right side of the semiconductor chip 21. A plurality of grooves 51 may be disposed on the left side of the semiconductor chip 21 and also a plurality of grooves 51 may be disposed on the right side of the semiconductor chip 21.

As illustrated in FIG. 3A, a resin 40 is provided on the lead frame 10. The resin 40 covers the upper surface of the die pad 11, upper surfaces of the terminals 12, the wires 70, joint portions between the wires 70 and the terminals 12, and joint portions between the wires 70 and the semiconductor chip 21. The resin 40 is also filled in between the terminals 12 and the die pad 11. The grooves 51 are filled with the resin 40. The resin 40 covers the upper surface and side surfaces of the semiconductor chip 21 which are provided outside the plate 23.

A slit 60 is formed in the resin 40 to extend in the longitudinal direction (Y-direction). The slit 60 is formed as an enclosed space blocked from the external environment, and the element region 22 is exposed to the slit 60 without being covered with the resin 40. The plate 23 is also exposed to the slit 60.

On the slit 60, the glass plate 30 is disposed to extend in the longitudinal direction (Y-direction). The glass plate 30 is a transparent plate having transmission with respect to light (for example, infrared rays) in the wavelength range to be sensed by the light-receiving element formed in the element region 22.

As illustrated in FIG. 3A, a recess portion 41 is formed on the upper surface of the resin 40, and the glass plate 30 is accommodated in the recess portion 41. In the bottom surface of the recess portion 41, grooves (second grooves) 80 are formed to extend in the longitudinal direction (Y-direction). For example, the grooves 80 surround continuously the periphery of the region in which the slit 60 is formed.

An adhesive 81 is supplied into the bottom surface of the recess portion 41 and the grooves 80 so that the glass plate 30 is adhered and fixed to the resin 40 with the adhesive 81. The glass plate 30 seals an opening on the upper portion of the slit 60.

In the example shown in FIG. 3A, three pairs of grooves 80 (six grooves 80 in total) are formed in the bottom surface of the recess portion 41 at positions where the opening of the slit 60 is interposed between the grooves in the width direction. The number of grooves 80 disposed on one side (left side) of the opening of the slit 60 is equal to the number of grooves 80 disposed on the other side (right side).

The size of the slit 60 in the width direction is larger than the size of the element region 22 in the width direction, and the size of the slit 60 in the longitudinal direction is also larger than the size of the element region 22 in the longitudinal direction. The size of the glass plate 30 in the width direction is larger than the size of the slit 60 in the width direction, and the size of the glass plate 30 in the longitudinal direction is also larger than the size of the slit 60 in the longitudinal direction.

As the size of the chip in the longitudinal direction becomes longer, the bending load is absorbed more in the resin package structure than in the ceramic package structure, and thus the load can affect sensing sensitivity. According to an embodiment, since the grooves 51 extending in the longitudinal direction are provided in the die pad 11, it is possible to make the die pad 11 have high strength with respect to the bending load. As a result, the load applied to the semiconductor chip 21 mounted on the die pad 11 can be reduced, thereby exhibiting a stable sensing performance.

In addition, the grooves 51 extend in the longitudinal direction without interruption in the middle, so that there is no concentration of stress occurring at discontinued portions. Further, the same number of groove 51 is disposed at the positions where the semiconductor chip 21 is interposed therebetween in the width direction, thereby maintaining the balance of strength between the left side and the right side of the semiconductor chip 21 with respect to the bending load. Therefore, this prevents an unbalanced load on the left side or the right side of the semiconductor chip 21.

In addition, the glass plate 30, which is harder than the resin 40, is disposed along the longitudinal direction of the rectangular semiconductor chip 21, so that the glass plate 30 also increases bending strength of the semiconductor device. As a transparent plate for closing the opening of the slit 60, any transparent resin plate may be used which is harder than the resin 40 for sealing and has high strength with respect to the bending load, without being limited to the glass plate 30.

Further, the grooves 80 are formed on the bottom surface of the recess portion 41 of the resin 40 accommodating the glass plate 30 and extend in the longitudinal direction. This increases the bending strength of the semiconductor device. Since the grooves 80 are disposed in the same number at positions where the opening of the slit 60 is interposed therebetween in the width direction, the balance of strength is maintained with respect to the bending load between the left side and the right side of the slit 60. Accordingly, this prevents an unbalanced load on the left side or the right side of the slit 60.

Figure 4A:
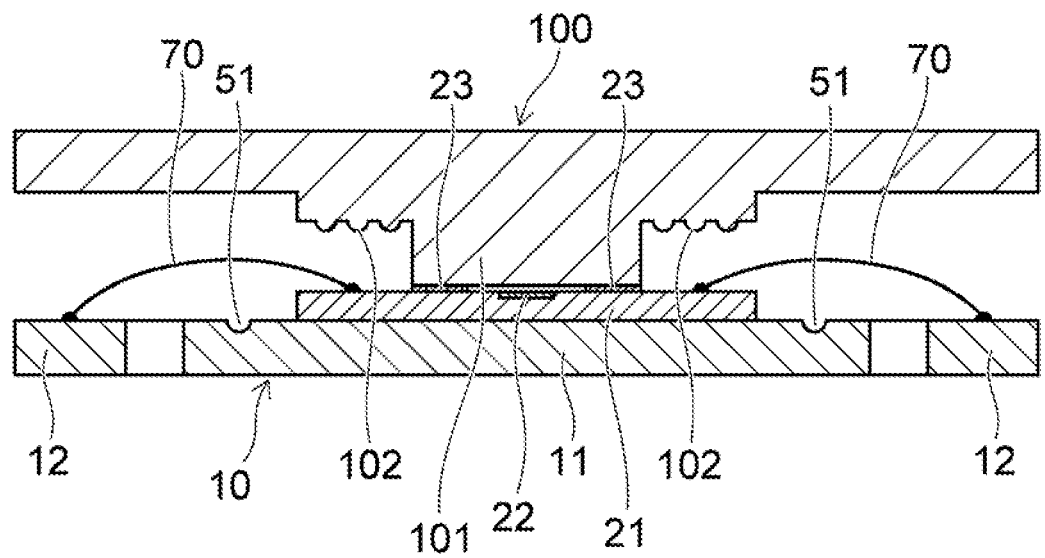
FIGS. 4A and 4B are schematic cross-sectional views that relate to a method of fabricating the semiconductor device according to an embodiment.
Figure 4B:
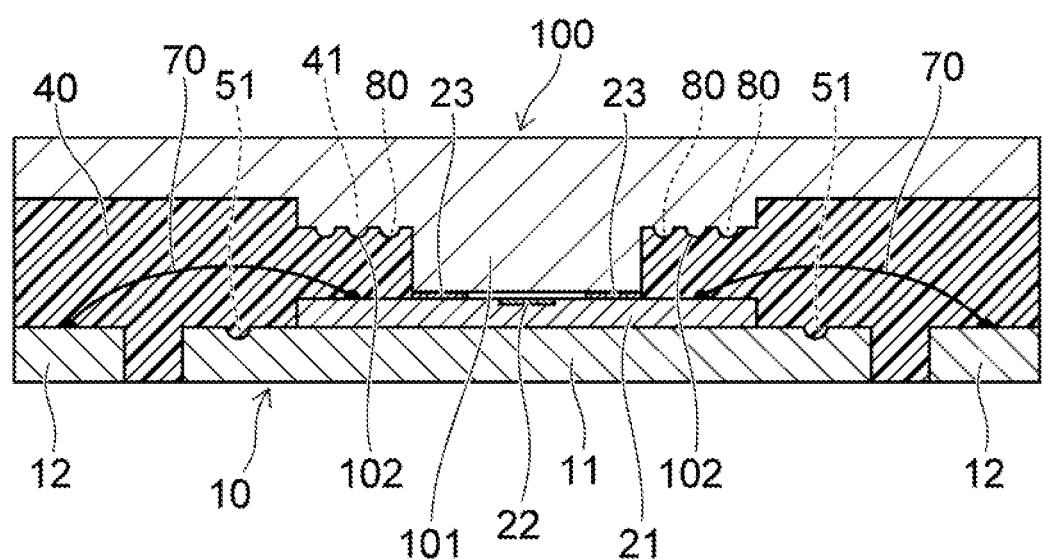

FIGS. 4A and 4B are schematic cross-sectional views illustrating a method of fabricating the semiconductor device according to an embodiment.

As illustrated in FIG. 4A, the semiconductor chip 21 is bonded on the die pad 11, and the electrode pads 71 (see, FIG. 2) of the semiconductor chip 21 and the terminals 12 are connected to each other with the wires 70.

The grooves 51 are formed on the upper surface of the die pad 11, for example by etching, before bonding the semiconductor chip 21.

After die bonding and wire bonding of the semiconductor chip 21, a jig 100 is pressed against the semiconductor chip 21 as illustrated in FIG. 4A.

The entire jig 100 extends in the longitudinal direction of the semiconductor chip 21. A lower surface of a convex portion 101 provided at the center of the jig 100 in the width direction is close contact to the plate 23 formed on the upper surface of the semiconductor chip 21. The lower surface of the convex portion 101 of the jig 100 is not in contact with the element region 22 of the semiconductor chip 21, and there is a fine gap between the lower surface of the convex portion 101 and the element region 22.

In addition, the jig 100 includes a plurality of protrusions 102 provided at positions where the convex portion 101 is interposed therebetween in the width direction. The convex portion 101 and the protrusions 102 extend continuously in the longitudinal direction of the semiconductor chip 21.

In the state where the lower surface of the convex portion 101 is close contact with the plate 23, a liquid resin 40 is supplied to a space between the jig 100 and the semiconductor chip 21 and a space between the jig 100 and the lead frame 10 as illustrated in FIG. 4B, and then the resin 40 is cured.

Since an area including the element region 22 inside the plate 23 is covered with the convex portion 101 of the jig 100, the resin 40 does not flow into the area inside the plate 23. Therefore, the element region 22 is not covered with the resin 40.

The recess portion 41 is formed on the upper surface of the resin 40 to correspond to the shape of the jig 100, and further the grooves 80 are formed on the bottom surface of the recess portion 41 to correspond to the protrusions 102 of the jig 100.

Thereafter, an adhesive is applied to the bottom surface of the recess portion 41 and into the grooves 80. At this time, the adhesive partially remains in the grooves 80. Therefore, even when a sufficient amount of adhesive is applied into the recess portion 41 for adhesion between the glass plate 30 and the resin 40, it is possible to prevent the adhesive from overflowing into the slit 60 when the glass plate 30 is pressed against the resin 40.

FIG. 3B is the schematic cross-sectional view similar to FIG. 3A.

At least a pair of protrusions (or ribs) 52 are formed on the upper surface of the die pad 11. The pair of protrusions are spaced from each other in the width direction (X-direction) of the die pad 11 and continuously extend in the longitudinal direction (Y-direction) without interruption.

The semiconductor chip 21 is mounted in a region between the pair of protrusions 52 on the upper surface of the die pad 11. The number of protrusions 52 disposed on one side of the semiconductor chip 21 in the width direction is equal to the number of the protrusions 52 disposed on the other side of the semiconductor chip in the width direction.

In the example shown in FIG. 3B, one protrusion 52 is disposed on the left side of the semiconductor chip 21 and one protrusion 52 is disposed on the right side of the semiconductor chip 21. In this case, a plurality of protrusions 52 may be disposed on the left side of the semiconductor chip 21 and a plurality of protrusions 52 may be disposed on the right side of the semiconductor chip 21.

Also in the example shown in FIG. 3B, the protrusions 52 extending in the longitudinal direction are provided on the die pad 11, and thus it is possible to give the die pad 11 high strength with respect to the bending load. As a result, it is possible to prevent the load from being applied to the semiconductor chip 21 mounted on the die pad 11, thereby achieving a stable sensing performance.

In addition, since the protrusions 52 extend in the longitudinal direction without interruption, there is no concentration of stress occurring at discontinued portions. Further, the same number of protrusions 52 are disposed at positions where the semiconductor chip 21 is interposed therebetween in the width direction, and thus the balance of strength is maintained between the left side and the right side of the semiconductor chip 21 with respect to the bending load. Accordingly, this prevents an unbalanced load from being concentrated on the left side or the right side of the semiconductor chip 21.

The element region 22 may comprise a light-emitting element and may include other elements. In this case, a transparent plate disposed on the slit 60 has transmission to the light emitted from the light-emitting element.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
    an elongated plate having at least a pair of first grooves, which are spaced from each other in a width direction and extend without interruption in a longitudinal direction, on a surface of the elongated plate;
    a semiconductor chip mounted on the surface of the elongated plate and including an element region which extends in the longitudinal direction;
    a resin having a slit that extends in the longitudinal direction of the elongated plate such that the element region is exposed by the slit, and a recess portion surrounding the slit, wherein one or more second grooves are formed in the recess portion and are located directly above the semiconductor chip; and
    a transparent plate that extends in the longitudinal direction of the elongated plate and covers the slit and the recess portion.

2. The semiconductor device according to claim 1, wherein
    the transparent plate is a glass plate.

3. The semiconductor device according to claim 1, wherein
    the semiconductor chip comprises a light-receiving element within the element region of the semiconductor chip that extends in the longitudinal direction.

4. The semiconductor device according to claim 1, wherein the number of the second grooves disposed on one side of the slit are equal to the number of the second grooves disposed on an opposite side of the slit.

5. The semiconductor device according to claim 4, wherein adhesive is partially applied to the second grooves formed in the recess portion.

6. The semiconductor device according to claim 4, wherein the transparent plate is a glass plate, and wherein the element region comprises light-receiving elements that sense infrared rays, arranged along the longitudinal direction.

7. The semiconductor device according to claim 1, wherein three pairs of the second grooves are formed in the recess portion, and an adhesive is partially applied to the three pairs of the second grooves.

8. The semiconductor device according to claim 1, wherein the transparent plate is a resin plate that is harder than the resin used for sealing.

9. The semiconductor device according to claim 1, further comprising:
    a plate on an upper surface of the semiconductor chip and that continuously surrounds the element region.

10. The semiconductor device according to claim 1, wherein the element region comprises light-receiving elements that sense infrared rays, arranged along the longitudinal direction.

11. The semiconductor device according to claim 10, wherein the elongated plate is surrounded by a plurality of terminals spaced apart from the elongated plate and are electrically connected to the light-receiving elements.

12. The semiconductor device according to claim 1, wherein
    the semiconductor chip comprises a light-emitting element.

* * * * *